United States Patent
Artman et al.

(10) Patent No.: US 7,545,630 B2
(45) Date of Patent: Jun. 9, 2009

(54) METHOD AND APPARATUS FOR THERMAL DISSIPATION

(75) Inventors: Paul T. Artman, Austin, TX (US); Jinsaku Masuyama, Cedar Park, TX (US)

(73) Assignee: Dell Products L.P., Round Rock, TX (US)

(*) Notice: Subject to any disclaimer, the term of this patent is extended or adjusted under 35 U.S.C. 154(b) by 296 days.

(21) Appl. No.: 11/264,325

(22) Filed: Nov. 1, 2005

(65) Prior Publication Data

US 2007/0097642 A1 May 3, 2007

(51) Int. Cl.
*H05K 7/20* (2006.01)
(52) U.S. Cl. .................. 361/679.47; 361/379.52; 361/679.54; 361/700; 62/180; 165/180
(58) Field of Classification Search .......... 361/683, 361/687, 695, 699, 700; 257/715, E23.088; 337/241; 62/184, 229, 180; 73/295; 165/80.3, 165/104.33, 122, 247, 104.26; 200/317
See application file for complete search history.

(56) References Cited

U.S. PATENT DOCUMENTS

| | | | |
|---|---|---|---|
| 5,936,508 A * | 8/1999 | Parker | 337/241 |
| 6,373,370 B1 * | 4/2002 | Darr et al. | 337/243 |
| 6,466,299 B1 * | 10/2002 | Lehtiniemi et al. | 349/199 |
| 6,515,857 B2 * | 2/2003 | Ford et al. | 361/687 |
| 6,526,768 B2 * | 3/2003 | Wall et al. | 62/184 |
| 6,564,742 B2 * | 5/2003 | Perner et al. | 116/216 |
| 6,644,056 B2 * | 11/2003 | Goth et al. | 62/229 |
| 6,859,131 B2 * | 2/2005 | Stanek et al. | 337/206 |
| 6,880,396 B2 * | 4/2005 | Rait | 73/295 |
| 6,909,602 B2 * | 6/2005 | Dietrich et al. | 361/687 |
| 7,002,054 B2 * | 2/2006 | Allen et al. | |
| 7,011,037 B2 * | 3/2006 | Cooperman | |
| 7,028,634 B1 * | 4/2006 | Lee | |
| 7,236,364 B2 * | 6/2007 | Lee | 361/701 |
| 7,246,919 B2 * | 7/2007 | Porchia et al. | 362/276 |
| 7,272,945 B2 * | 9/2007 | Bash et al. | 62/180 |
| 7,327,559 B2 * | 2/2008 | Fox | 361/680 |
| 2003/0147527 A1 * | 8/2003 | Mulligan et al. | 379/433.01 |
| 2004/0042172 A1 * | 3/2004 | Kusaka et al. | 361/687 |
| 2004/0065148 A1 * | 4/2004 | Ham | 73/295 |
| 2004/0069461 A1 * | 4/2004 | Yuyama et al. | 165/104.26 |
| 2004/0200277 A1 * | 10/2004 | Feldstein et al. | 73/304 R |
| 2004/0226363 A1 * | 11/2004 | Rait | 73/295 |
| 2005/0075420 A1 * | 4/2005 | Stovold | 523/161 |
| 2005/0087329 A1 * | 4/2005 | Zhang et al. | 165/104.33 |
| 2006/0022214 A1 * | 2/2006 | Morgan et al. | 257/99 |
| 2006/0039112 A1 * | 2/2006 | Minamitani et al. | 361/699 |
| 2006/0290461 A1 * | 12/2006 | Darr et al. | 337/206 |

* cited by examiner

*Primary Examiner*—Jayprakash N Gandhi
*Assistant Examiner*—Courtney Smith
(74) *Attorney, Agent, or Firm*—Haynes and Boone, LLP

(57) ABSTRACT

A thermal dissipation apparatus includes a thermal transfer device including a heat pipe member. A temperature sensitive material is coupled to the heat pipe member and is operable to provide a visual indication of the heat transfer in the heat pipe member. The thermal dissipation apparatus may be coupled to a heat producing component in order to dissipate heat from the component, and the temperature sensitive material will allow the function of the heat pipe member to be visually determined.

16 Claims, 6 Drawing Sheets

*Fig. 4b*

METHOD AND APPARATUS FOR THERMAL DISSIPATION

BACKGROUND

The present disclosure relates generally to information handling systems, and more particularly to thermal dissipation in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

With the increase in information handling system performance, it has become more difficult to meet the thermal requirements of information handling system components. To solve component thermal concerns, heat sinks are often used to increase the convective heat transfer from the component to the surrounding environment. Recently, there has been an increasing trend to use heat sinks with embedded heat pipes due to their high performance and low system sound emission. With these heat pipe heat sink developments, up to 100% of the heat transfer from the heat sink to the heat sink fins is through the heat pipes.

A drawback of these heat pipe heat sink developments is that they typically have very little thermal mass, and they can be greatly affected by heat pipe quality issues. Furthermore, heat pipes are also limited by heat pipe power capacity, which can be greatly reduced due to bending or flattening operations required in the heat sink. The heat pipe heat sink efficiency can be greatly reduced by the failure of even one of the heat pipes.

Evaluating the efficiency of heat pipe heat sinks is typically done during manufacturing using an in-line test fixture that works as a gross screen for the heat sinks. However, such testing cannot catch heat pipe dry out, where the amount of fluid evaporating inside the heat pipe exceeds the capacity of the wicking to return the fluid, which can cause the heat sink to fail. Individual heat pipe samples may be tested for heat pipe dry out, but the procedure is cost-prohibitive to conduct for all the heat pipes used in large scale information handling system producing factories. Furthermore, testing will not detect outgassing, which is a function of temperature, temperature cycling, and time. Conventional in-chassis factory screens of heat pipe heat sinks are typically of low accuracy and difficult to implement.

Accordingly, it would be desirable to provide for thermal dissipation absent the disadvantages found in the prior methods discussed above.

SUMMARY

According to one embodiment, a thermal dissipation apparatus includes a thermal transfer device including a heat pipe member, and a temperature sensitive material coupled to the heat pipe member and operable to provide a visual indication of the heat transfer in the heat pipe member.

BRIEF DESCRIPTION OF THE DRAWINGS

FIG. 2b is a cut away perspective view illustrating an embodiment of the thermal dissipation apparatus of FIG. 2a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
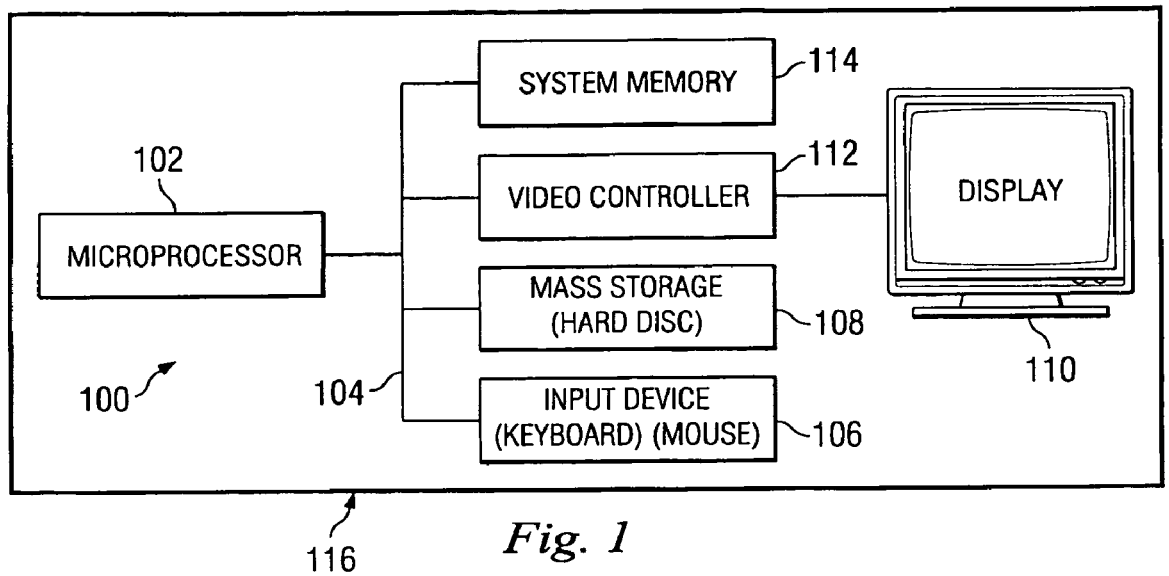
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2A:
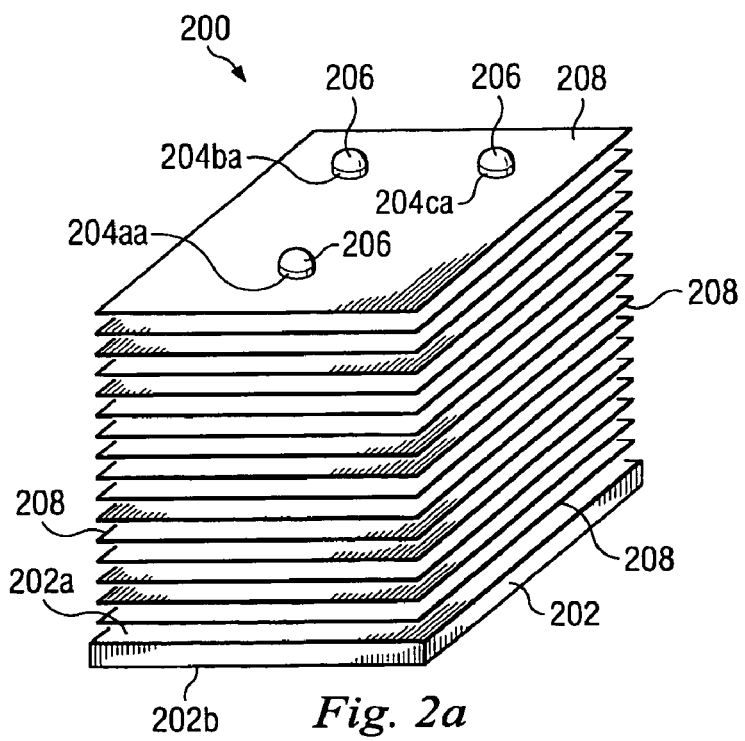
FIG. 2a is a perspective view illustrating an embodiment of a thermal dissipation apparatus.
Figure 2B:
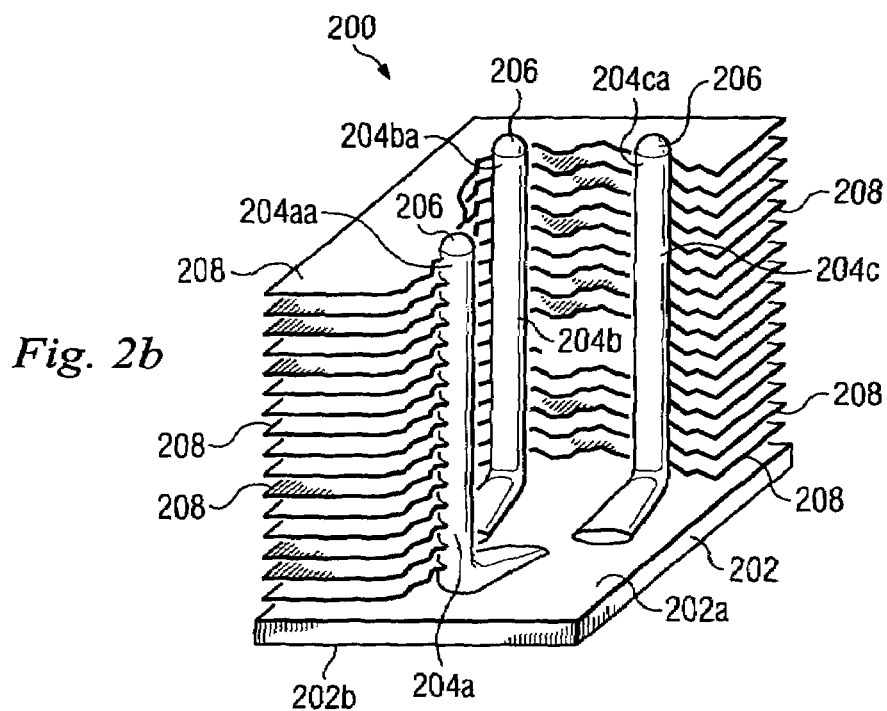

Referring now to FIGS. 2a and 2b, a thermal dissipation apparatus 200 is illustrated. The thermal dissipation apparatus 200 includes a thermal transfer device 202 having a top surface 202a and a bottom surface 202b located opposite the top surface 202a. A plurality of heat transfer members 204a, 204b, and 204c extend vertically from the top surface 202a of the thermal transfer device 202 in a spaced apart orientation with respect to each other, as illustrated in FIG. 2b, with each heat transfer member 204a, 204b, and 204c including a respective distal end 204aa, 204ba, and 204ca. In an embodiment, the plurality of heat transfer members 204a, 204b, and 204c are heat pipe members and the thermal dissipation apparatus 200 is a remote heat pipe heat sink. In an embodiment, the heat pipe members are conventional heat pipes known in the art. In an embodiment, the heat transfer members 204a, 204b, and 204c may be any component of the thermal dissipation apparatus 200 which is used to dissipate thermal energy from a heat producing component such as, for example, heat pipes, heat fins, thermal grease, combinations thereof, and a variety of other heat transfer members known in the art. A temperature sensitive material 206 is coupled to the distal ends 204aa, 204ba, and 204ca of the heat transfer members 204a, 204b, and 204c. In an embodiment, the temperature sensitive material 206 includes a color changing material which is operable to change colors upon a change in the temperature of the temperature sensitive material 206. In an embodiment, the temperature sensitive material 206 includes a color changing material which has been provided to change color in the operating temperature range of the heat transfer members 204a, 204b, and 204c of the thermal dissipation apparatus 200. In an embodiment, the temperature sensitive material 206 includes a color changing material which is operable to provide a complete color shift over a 3-6 degree Centigrade temperature range. In an embodiment, the temperature sensitive material 206 includes Leucodye thermochromic ink. In an embodiment, the temperature sensitive material 206 is a color changing ink or clay. In an embodiment, the temperature sensitive material 206 is located along the length of the heat transfer members 204a, 204b, and 204c, rather than only at the distal ends 204aa, 204ba, and 204ca. A plurality of substantially parallel and spaced apart heat fins 208 are coupled to the heat transfer members 204a, 204b, and 204c and located on the thermal dissipation apparatus 200 above the heat transfer device 202.

Figure 3:
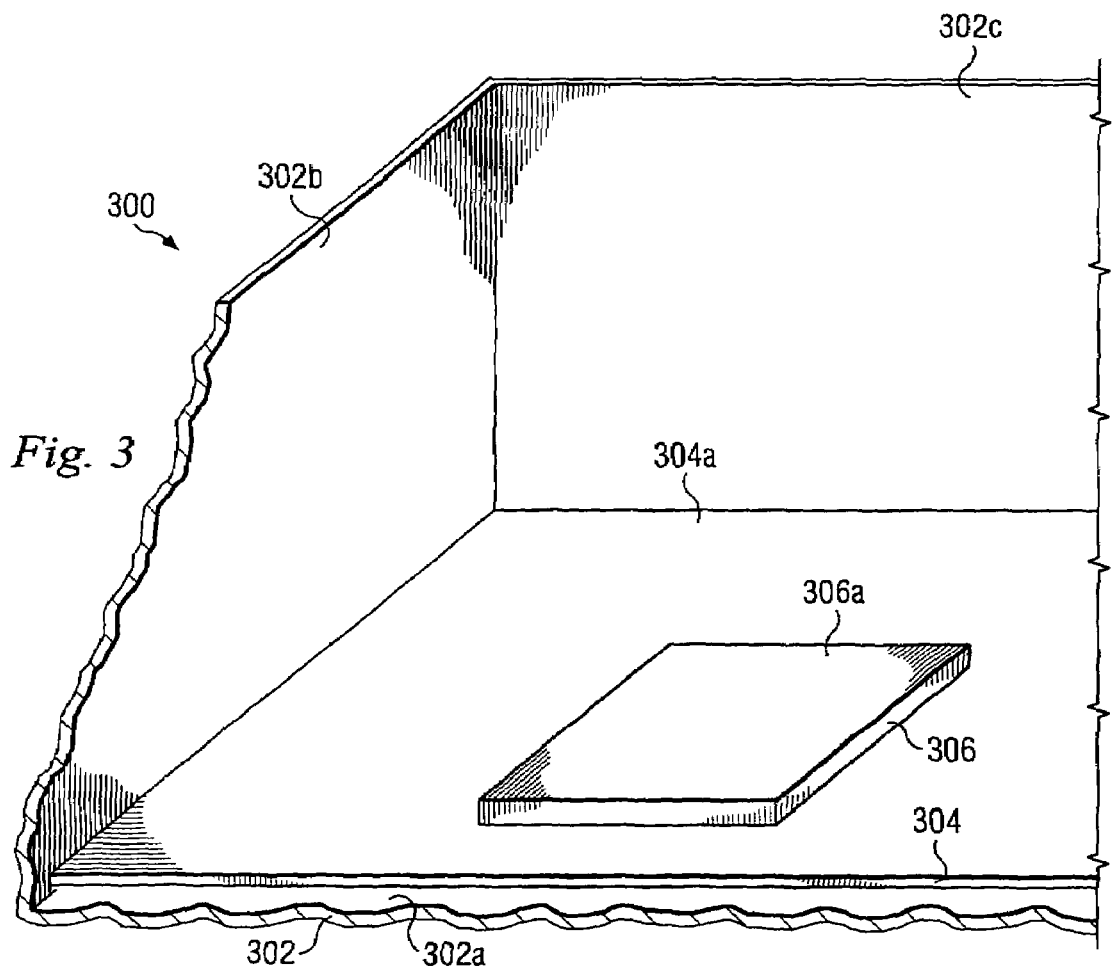
FIG. 3 is a perspective view illustrating an embodiment of a chassis used with the thermal dissipation apparatus of FIGS. 2a and 2b.

Referring now to FIGS. 1 and 3, a chassis 300 is illustrated. The chassis 300 includes a base 302 having a top surface 302a and a plurality of side walls 302b and 302c extending from the top surface 302a. A board 304 is mounted to the top surface 302a of the chassis 300 and includes a top surface 304a. A heat producing component 306 is mounted to the top surface 304a of the board 304 and includes a top surface 306a. In an embodiment, the chassis 300 is the chassis 116, described above with respect to FIG. 1, and houses some or all of the information handling system components of the information handling system 100, described above with respect to FIG. 1. In an embodiment, the heat producing component 306 is the microprocessor 102, described above with respect to FIG. 1.

Figure 4A:
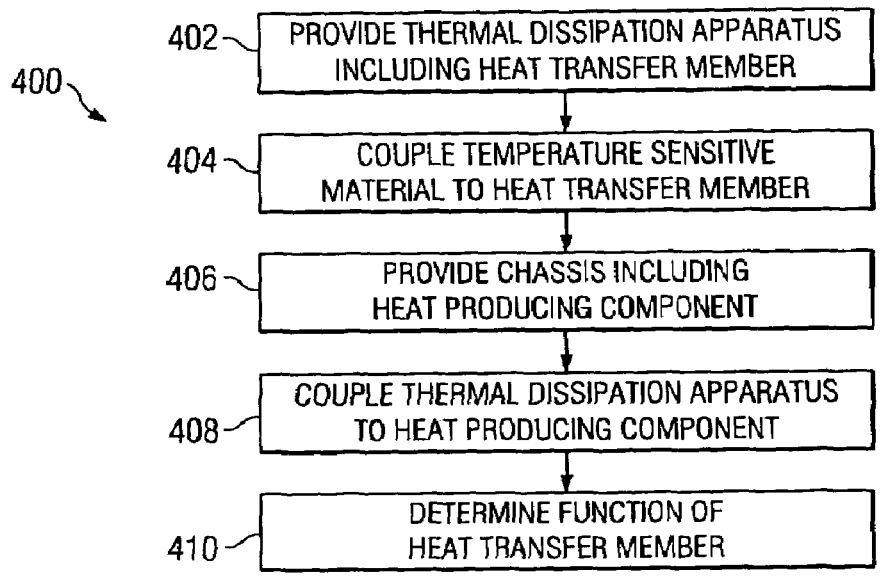
FIG. 4a is a flow chart illustrating an embodiment of a method for thermal dissipation.

Referring now to FIGS. 2a, 2b, and 4a, a method 400 for thermal dissipation is illustrated. The method 400 begins at step 402 where the thermal dissipation apparatus 200 including the heat transfer members 204a, 204b, and 204c, described above with reference to FIGS. 2a and 2b, is provided. The method 400 then proceeds to step 404 where the temperature sensitive material 206 is coupled to the heat transfer members 204a, 204b, and 204c. The temperature sensitive material 206 is illustrated in FIGS. 2a and 2b as already coupled to the heat transfer members 204a, 204b, and 204c, and may be coupled to the heat transfer members 204a, 204b, and 204c using methods known in the art.

Figure 4B:
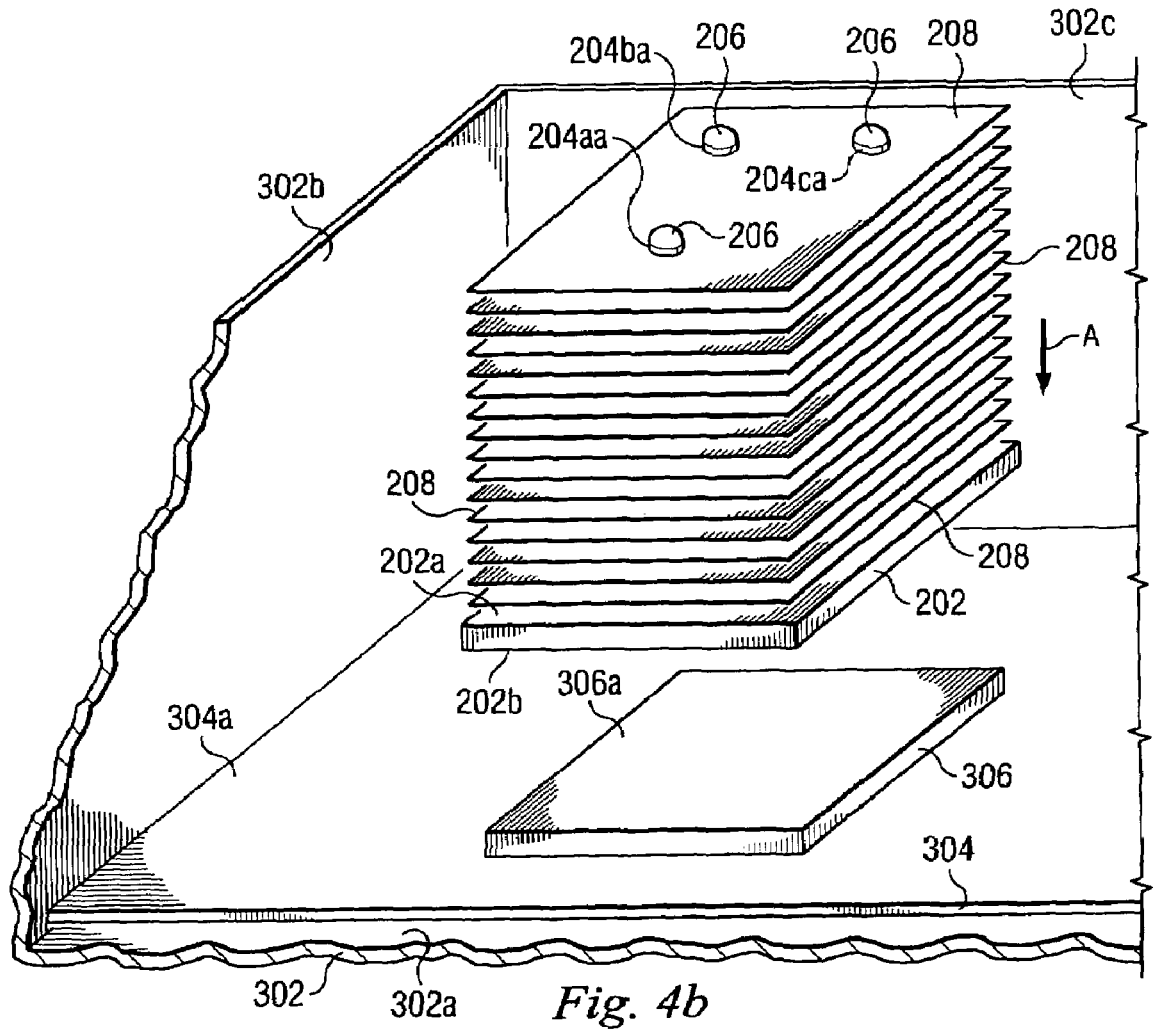
FIG. 4b is a perspective view illustrating the thermal dissipation apparatus of FIGS. 2a and 2b being coupled to the chassis of FIG. 3.

Referring now to FIGS. 2a, 2b, 3, 4a, 4b, and 4c, the method 400 proceeds to step 406 where the chassis 300 including the heat producing component 306, described above with reference to FIG. 3, is provided. The method 400 then proceeds to step 408 where the thermal dissipation apparatus 200 is coupled to the heat producing component 306. The thermal dissipation apparatus 200 is positioned above the heat producing component 306 such that the bottom surface 202b of the thermal dissipation device 202 is positioned above and adjacent to the top surface 306a of the heat producing component 306, as illustrated in FIG. 4b. The thermal dissipation apparatus 200 is then moved in a direction A such that the bottom surface 202b of the thermal dissipation device 202 engages the top surface 306a of the heat producing component 306. In an embodiment, a thermal grease or equivalent material may be provided between the heat producing component 306 and the thermal dissipation apparatus 200 in order to facilitate heat transfer between the heat producing component 306 and the thermal dissipation apparatus 200. The thermal dissipation apparatus 200 may then be mounted to the heat producing component 306 and/or the board 304 using methods known in the art in order to hold the thermal dissipation apparatus 200 in contact with the heat producing component 306.

Figure 4C:
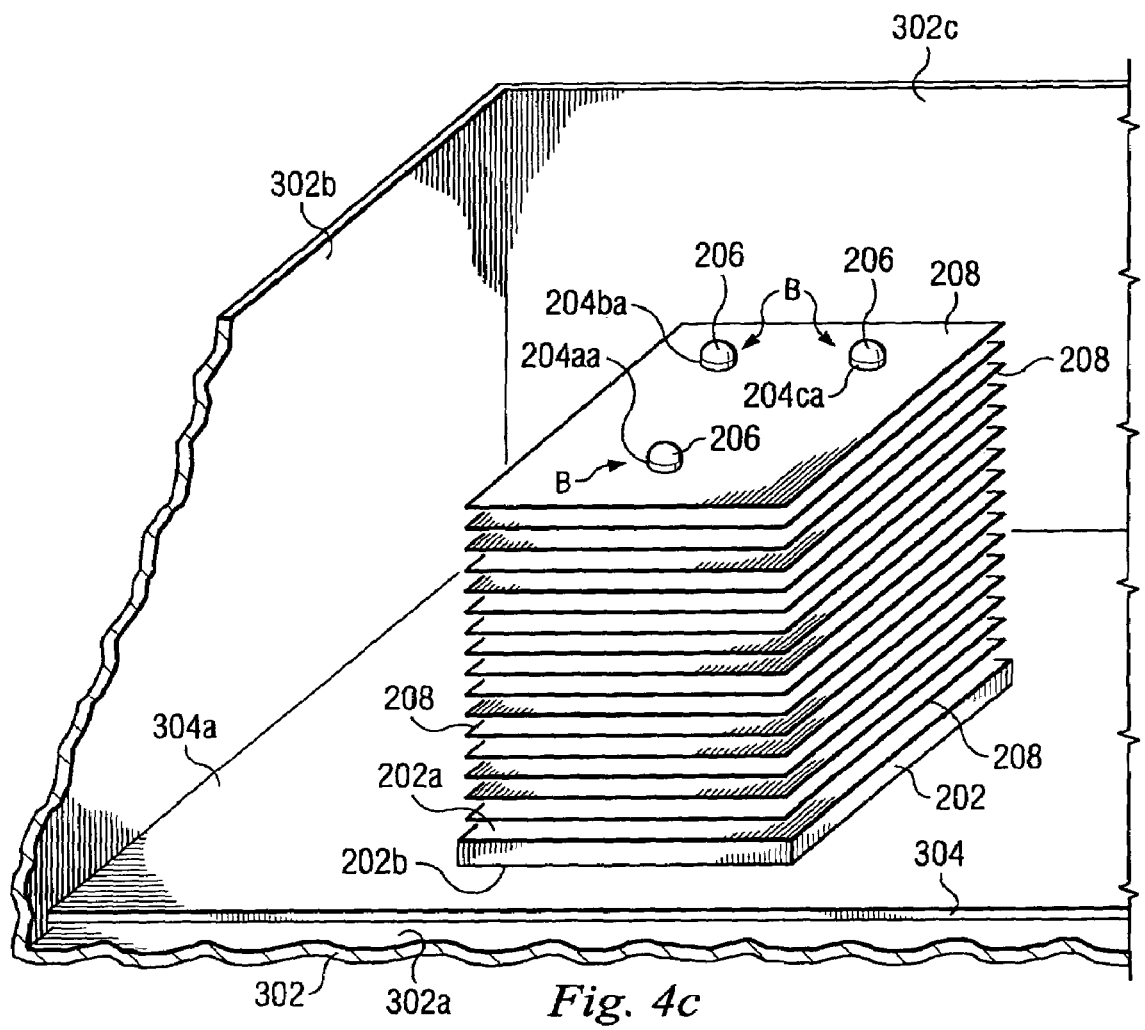
FIG. 4c is a perspective view illustrating the thermal dissipation apparatus of FIGS. 2a and 2b coupled to the chassis of FIG. 3.
Figure 4D:
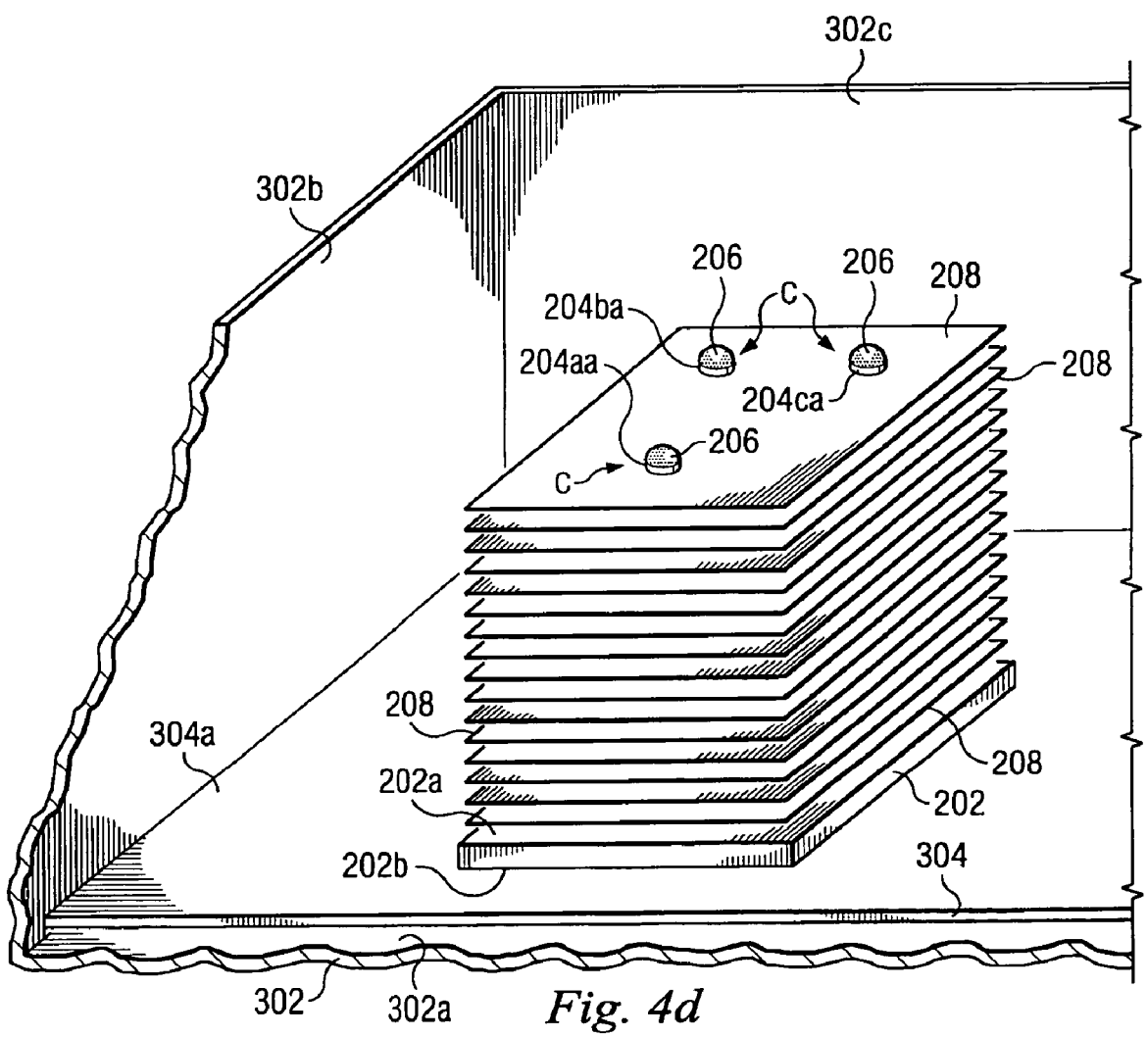
FIG. 4d is a perspective view illustrating the thermal dissipation apparatus and the chassis of FIG. 4c with all the heat transfer members functioning.

Referring now to FIGS. 2a, 2b, 3, 4a, 4c, 4d, and 4e, the method 400 proceeds to step 410, where the function of the heat transfer members 204a, 204b, and 204c are determined. When the heat producing component 306 is not producing any heat, the heat transfer members 204a, 204b, and 204c remain relatively cool, and the temperature sensitive material 206 remains a first color B, as illustrated in FIG. 4c.

In an alternative embodiment, the heat producing component 306 may be producing heat, but the heat transfer members 204a, 204b, and 204c may all be failing due to a variety of reasons such as, for example, heat pipe dry out, outgassing, improper soldering, or a variety of other heat pipe failure mechanisms known in the art. Proper heat pipe operation produces a large temperature increase in the heat pipe, which indicates heat transfer. In this case, the heat transfer members 204a, 204b, and 204c will have very little heat transfer along their lengths, and the temperature sensitive material 206 will not be heated sufficiently in order to change its color, resulting in the temperature sensitive material 206 remaining the first color B, as illustrated in FIG. 4c.

In an alternative embodiment, the heat producing component 306 may be producing heat, and the heat transfer members 204aa, 204ba, and 204ca may all be functioning properly. Proper heat pipe operation produces a large temperature increase in the heat pipe, which indicates heat transfer. In this case, the heat transfer members 204a, 204b, and 204c will transfer heat along their lengths, and the temperature sensitive material 206 will be heated sufficiently to change its color from the first color B, illustrated in FIG. 4c, to a second color C, illustrated in FIG. 4d. In an embodiment, the temperature sensitive material 206 is chosen such that they change to the second color C only when the temperature at the distal end 204aa, 204ba, and 204ca of the heat transfer members 204a, 204b, and 204c, respectively, is indicative of a fully functioning heat transfer member. In an embodiment, the temperature sensitive material 206 may be provided to gradually change color in order to indicate different levels of functioning of the heat transfer members 204a, 204b, and 204c.

Figure 4E:
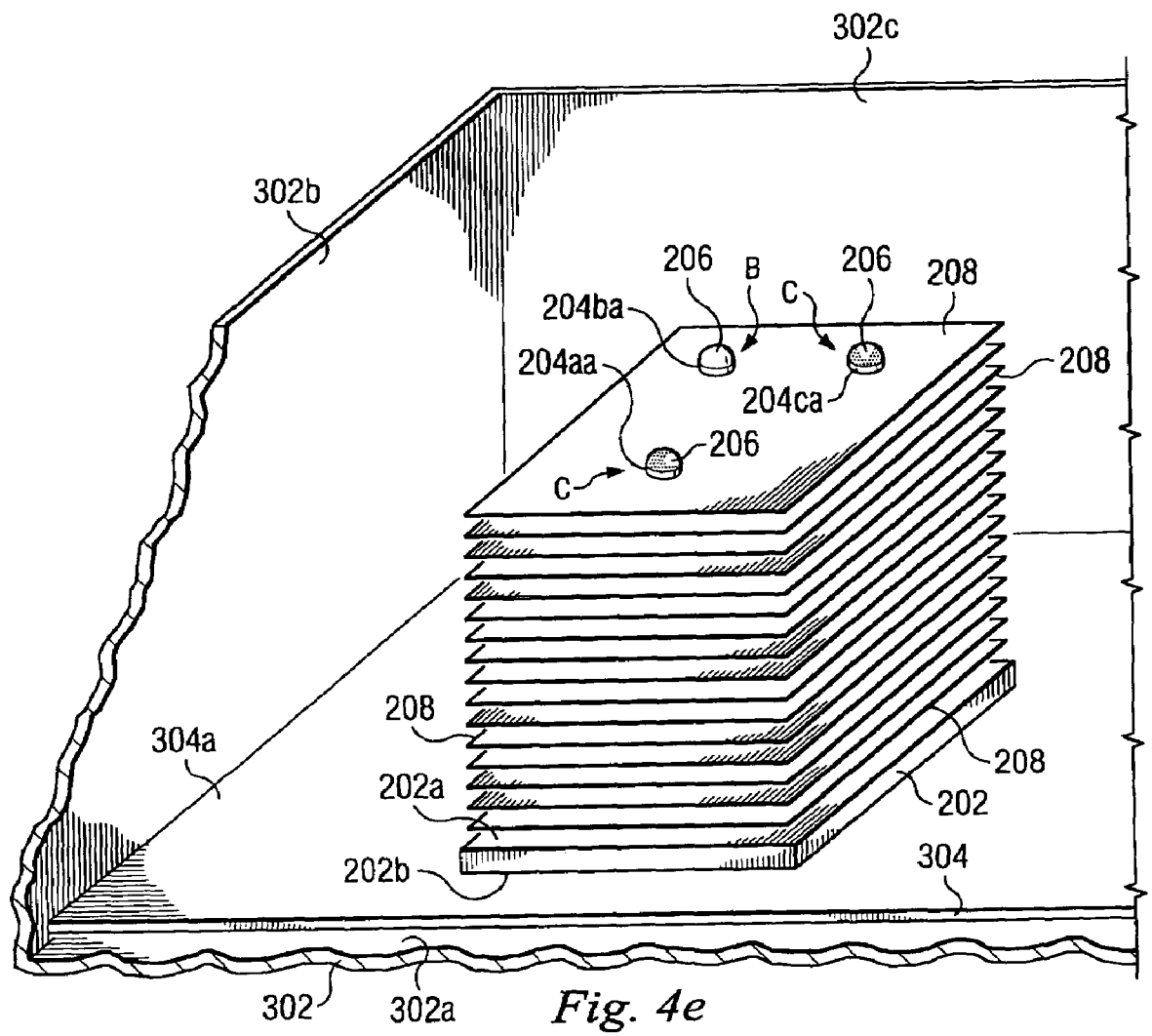
FIG. 4e is a perspective view illustrating the thermal dissipation apparatus and the chassis of FIG. 4c with one of the heat transfer members failing.

In an alternative embodiment, the heat producing component 306 may be producing heat, and the heat transfer members 204aa and 204ca may be functioning properly, but the heat transfer member 204ba may be failing due to a variety of reasons such as, for example, heat pipe dry out, outgassing, improper soldering, or a variety of other heat pipe failure mechanisms known in the art. Proper heat pipe operation produces a large temperature increase in the heat pipe, which indicates heat transfer. In this case, the heat transfer members 204a and 204c will transfer heat along their lengths, and the temperature sensitive material 206 on the distal ends 204aa and 204ca to be heated sufficiently to change its color from the first color B, illustrated in FIG. 4c, to a second color C, illustrated in FIG. 4e. However, the heat transfer member 204b will have very little heat transfer along its length, and the temperature sensitive material 206 on the distal end 204ba will not be heated sufficiently in order to change its color, resulting in the temperature sensitive material 206 remaining the first color B, as illustrated in FIG. 4e. In this embodiment, a visual indication is provided that the heat transfer member 204b is not functioning properly and needs to be replaced. In an embodiment, the temperature sensitive material 206 is chosen such that it changes to the second color C only when the temperature at the distal ends 204aa and 204ca of the heat transfer members 204a and 204c, respectively, is indicative of a fully functioning heat transfer member. In an embodiment, the temperature sensitive material 206 may be designed to gradually change color in order to indicate different levels of functioning of the heat transfer members 204a, 204b, and 204c. Thus, a method 400 and apparatus 200 are provided which allow an inexpensive and visual means for determining the function of heat transfer members in a thermal dissipation apparatus in order to provide efficient thermal dissipation for a heat producing component.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A thermal dissipation apparatus, comprising:
    a thermal transfer device including a plurality of heat pipes operable to dissipate heat from a heat producing component, each of the plurality of heat pipes comprising a distal end, wherein the plurality of heat pipes are coupled to at least one heat fin, and wherein the distal end of each of the plurality of heat pipes is located on a first side of the at least one heat fin and a portion of each of the plurality of heat pipes is located on a second side of the at least one heat fin that is opposite the first side; and
    a temperature sensitive material located on the distal end of each of the plurality of heat pipes and in direct engagement with each of the plurality of heat pipes, the temperature sensitive material selected to provide a color change only when the temperature of the heat pipe which that temperature sensitive material is located on is indicative of a fully functioning heat pipe, wherein the temperature sensitive material is operable to provide a visual indication to a user of whether the heat pipe which that temperature sensitive material is located on is fully functional via the color change in response to the heat pipe fully functioning to transfer sufficient heat to produce the color change.

2. The apparatus of claim 1, wherein the plurality of heat pipes extend vertically on the thermal transfer device.

3. The apparatus of claim 1, wherein the temperature sensitive material comprises a color changing ink.

4. The apparatus of claim 1, wherein the distal end of each of the plurality of heat pipes is visible to a user while the at least one heat fin obscures from the user the portion of each of the plurality of heat pipes located on the second side of the at least one heat fin.

5. The apparatus of claim 1, wherein the temperature sensitive material is operable to provide a complete color shift over a temperature range of 3 to 6 degrees Centigrade.

6. The apparatus of claim 1, further comprising:
    a plurality of heat fins coupled to the plurality of heat pipes.

7. An information handling system, comprising:
    a chassis;
    a heat producing component mounted in the chassis;
    a thermal transfer device coupled to the heat producing component and including a plurality of heat pipes operable to dissipate heat from the heat producing component, each of the plurality of heat pipes comprising a distal end, wherein the plurality of heat pipes are coupled to at least one heat fin, and wherein the distal end of each of the plurality of heat pipes is located on a first side of the at least one heat fin and a portion of each of the plurality of heat pipes is located on a second side of the at least one heat fin that is opposite the first side; and
    a temperature sensitive material located on the distal end of each of the plurality of heat pipes and in direct engagement with each of the plurality of heat pipes, the temperature sensitive material selected to provide a color change only when the temperature of the heat pipe which that temperature sensitive material is located on is indicative of a fully functional heat pipe, wherein the temperature sensitive material is operable to provide a visual indication to a user of whether the heat pipe which that temperature sensitive material is located on is fully functional via the color change in response to the heat pipe fully functioning to transfer sufficient heat to produce the color change.

8. The system of claim 7, wherein the heat producing component is a microprocessor.

9. The system of claim 7, wherein the plurality of heat pipes extend vertically on the thermal transfer device.

10. The system of claim 7, wherein the temperature sensitive material comprises a color changing ink.

11. The system of claim 7, wherein the temperature sensitive material is located along the length of the heat pipes.

12. The system of claim 7, wherein the distal end of each of the plurality of heat pipes is visible to user while the at least one heat fin obscures from the user the portion of each of the plurality of heat pipes located on the second side of the at least one heat fin.

13. The system of claim 7, further comprising:
a plurality of heat fins coupled to the plurality of heat pipes.

14. A method for thermal dissipation, comprising:
providing a thermal dissipation device including a plurality of heat pipes;
selecting a temperature sensitive material that provides a color change only when the temperature of the heat pipe which the temperature sensitive material is in direct engagement with is indicative of a fully functioning heat pipe; and
positioning the temperature sensitive material on a distal end of each of the plurality of heat pipes and in direct engagement with each of the plurality of heat pipes such that the temperature sensitive material provides a visual indication to a user of whether the heat pipe which that temperature sensitive material is located on is fully functional via the color change in response to the heat pipe fully functioning to transfer sufficient heat to produce the color change, wherein the plurality of heat pipes are coupled to at least one heat fin, and wherein the distal end of each of the plurality of heat pipes is located on a first side of the at least one heat fin and a portion of each of the plurality of heat pipes is located on a second side of the at least one heat fin that is opposite the first side.

15. The method of claim 14, further comprising:
providing a chassis including a heat producing component mounted in the chassis; and
coupling the thermal dissipation device to the heat producing component.

16. An information handling system (IHS) comprising:
a chassis including a heat producing component;
a plurality of elongated heat pipes coupled to the component for transferring heat from the component; and
a visual indicator of temperature increase located on a distal end of each of the plurality of heat pipes and in direct engagement with each of the plurality of heat pipes, the visual indicator of temperature increase selected to provide a color change only when the temperature of the heat pipe which that visual indicator of temperature is located on is indicative of a fully functioning heat pipe, wherein upon visual inspection of the plurality of heat pipes, full functioning of a given heat pipe is observable through the visual indicator by means of the color change of the visual indicator in response to the given heat pipe fully functioning to transfer sufficient heat to produce the color change and conversely, a lack of color change of the visual indicator indicating that the given heat pipe is not fully functional, wherein the plurality of heat pipes are coupled to at least one heat fin, and wherein the distal end of each of the plurality of heat pipes is located on a first side of the at least one heat fin and a portion of each of the plurality of heat pipes is located on a second side of the at least one heat fin that is opposite the first side.

* * * * *